(12) United States Patent
Horita (10) Patent No.: US 11,955,933 B2
(45) Date of Patent: Apr. 9, 2024

(54) HIGH-FREQUENCY MODULE AND COMMUNICATION DEVICE

(71) Applicant: Murata Manufacturing Co., Ltd., Kyoto (JP)

(72) Inventor: Atsushi Horita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 324 days.

(21) Appl. No.: 17/644,137

(22) Filed: Dec. 14, 2021

(65) Prior Publication Data

US 2022/0109409 A1 Apr. 7, 2022

Related U.S. Application Data

(63) Continuation of application No. PCT/JP2020/019810, filed on May 19, 2020.

(30) Foreign Application Priority Data

Jun. 26, 2019 (JP) .................................. 2019-118895

(51) Int. Cl.
  *H04B 1/40* (2015.01)
  *H01L 23/66* (2006.01)
  (Continued)

(52) U.S. Cl.
  CPC .............. *H03F 1/565* (2013.01); *H01L 23/66* (2013.01); *H03F 3/19* (2013.01); *H04B 1/40* (2013.01);
  (Continued)

(58) Field of Classification Search
  None
  See application file for complete search history.

(56) References Cited

U.S. PATENT DOCUMENTS

| 11,251,829 B2* | 2/2022 | Harada | H04B 1/50 |
| 2010/0253435 A1* | 10/2010 | Ichitsubo | H01L 23/16 |
| | | | 29/832 |

(Continued)

FOREIGN PATENT DOCUMENTS

| WO | 2018/110393 A1 | 6/2018 |
| WO | 2018/168500 A1 | 9/2018 |

(Continued)

OTHER PUBLICATIONS

International Search Report for PCT/JP2020/019810 dated Jun. 30, 2020.
Written Opinion for PCT/JP2020/019810 dated Jun. 30, 2020.

*Primary Examiner* — Pablo N Tran
(74) *Attorney, Agent, or Firm* — Pearne & Gordon LLP (57) ABSTRACT

A high-frequency module and a communication device capable of suppressing deterioration of a noise figure of a low-noise amplifier are provided. A high-frequency module (1) includes a mounting substrate (2), a low-noise amplifier (12), an input switch (20), and a matching circuit (30). The input switch (20) is connected to an input terminal of the low-noise amplifier (12). The matching circuit (30) performs impedance matching between the input switch (20) and the low-noise amplifier (12). The matching circuit (30) is disposed on a first main surface (21) in a first direction (D1) of the mounting substrate (2). The input switch (20) and the low-noise amplifier (12) are disposed on a second main surface (22) opposed to the first main surface (21). When the mounting substrate (2) is viewed in plan, the input switch (20) overlaps at least a part of the matching circuit (30).

20 Claims, 8 Drawing Sheets

(51) Int. Cl.
   *H03F 1/56*     (2006.01)
   *H03F 3/19*     (2006.01)
   *H03F 3/24*     (2006.01)

(52) U.S. Cl.
   CPC ............... *H01L 2223/6611* (2013.01); *H01L 2223/6655* (2013.01); *H01L 2223/6677* (2013.01); *H03F 2200/165* (2013.01); *H03F 2200/222* (2013.01); *H03F 2200/294* (2013.01)

(56) References Cited

U.S. PATENT DOCUMENTS

| | | | |
|---|---|---|---|
| 2010/0321129 A1* | 12/2010 | Onody | H03F 1/56 |
| | | | 333/124 |
| 2011/0037170 A1* | 2/2011 | Shinohara | H01L 21/565 |
| | | | 257/737 |
| 2012/0286894 A1 | 11/2012 | Vogas | |
| 2013/0207732 A1* | 8/2013 | Cabanillas | H03F 1/565 |
| | | | 330/192 |
| 2014/0320205 A1 | 10/2014 | Lyalin et al. | |
| 2015/0070096 A1* | 3/2015 | Watanabe | H03F 3/195 |
| | | | 330/296 |
| 2019/0214355 A1 | 7/2019 | Nishikawa | |
| 2020/0007096 A1 | 1/2020 | Kita | |
| 2020/0195284 A1 | 6/2020 | Watanabe | |
| 2020/0228151 A1 | 7/2020 | Naniwa et al. | |
| 2021/0203371 A1* | 7/2021 | Hanaoka | H01L 25/18 |
| 2021/0320682 A1* | 10/2021 | Tada | H04B 1/006 |

FOREIGN PATENT DOCUMENTS

| | | | |
|---|---|---|---|
| WO | 2018/168653 A1 | 9/2018 | |
| WO | 2019/065311 A1 | 4/2019 | |

\* cited by examiner

HIGH-FREQUENCY MODULE AND COMMUNICATION DEVICE

CROSS REFERENCE TO RELATED APPLICATION

This is a continuation of International Application No. PCT/JP2020/019810 filed on May 19, 2020 which claims priority from Japanese Patent Application No. 2019-118895 filed on Jun. 26, 2019. The contents of these applications are incorporated herein by reference in their entireties.

BACKGROUND OF THE DISCLOSURE

Field of the Disclosure

The present disclosure relates generally to a high-frequency module and a communication device, and more particularly to a high-frequency module and a communication device for communicating high-frequency signals.

Description of the Related Art

In the past, a front-end module (high-frequency module) has been known (see Patent Document 1). The front-end module includes a substrate (mounting substrate), and a switch IC and a filter that are provided on the substrate. The switch IC, which is a semiconductor element, is configured with a first switch unit, a second switch unit, a third switch unit (input switch), and an amplifier unit.

In the front-end module of Patent Document 1, the third switch unit is connected to an input terminal of the amplifier unit (low-noise amplifier) with a matching circuit interposed therebetween, which matches the third switch unit and the amplifier unit.

Patent Document 1: International Publication No. 2018/110393

BRIEF SUMMARY OF THE DISCLOSURE

In the front-end module of Patent Document 1, a path between the third switch unit and the matching circuit may be lengthened depending on the configuration of the switch IC. When the path between the third switch unit and the matching circuit is lengthened, a wiring loss occurs, and as a result, there is a possibility that a noise figure of the amplifier unit deteriorates.

The present disclosure has been made in view of the above problem, and an object thereof is to provide a high-frequency module and a communication device capable of suppressing the deterioration of a noise figure of a low-noise amplifier.

A high-frequency module according to an aspect of the present disclosure includes a mounting substrate, a low-noise amplifier, an input switch, and a matching circuit. The mounting substrate has a first main surface and a second main surface opposed to each other. The input switch is connected to an input terminal of the low-noise amplifier. The matching circuit performs impedance matching between the input switch and the low-noise amplifier. The matching circuit is disposed on the first main surface. The input switch and the low-noise amplifier are disposed on the second main surface. When the mounting substrate is viewed in plan, the input switch overlaps at least a part of the matching circuit.

A high-frequency module according to an aspect of the present disclosure includes a mounting substrate, a low-noise amplifier, an input switch, and a matching circuit. The mounting substrate has a first main surface and a second main surface opposed to each other. The input switch is connected to an input terminal of the low-noise amplifier. The matching circuit performs impedance matching between the input switch and the low-noise amplifier. The input switch and the matching circuit are disposed on or above the first main surface. The low-noise amplifier is disposed on the second main surface. When the mounting substrate is viewed in plan, the matching circuit and the input switch overlap each other.

A high-frequency module according to an aspect of the present disclosure includes a mounting substrate, a low-noise amplifier, an input switch, and a matching circuit. The input switch is connected to an input terminal of the low-noise amplifier. The matching circuit performs impedance matching between the input switch and the low-noise amplifier. One of the matching circuit and the input switch is disposed on a main surface of the mounting substrate, and another is built in the mounting substrate. When the mounting substrate is viewed in plan, the input switch overlaps at least a part of the matching circuit.

A communication device according to an aspect of the present disclosure includes the high-frequency module, and a signal processing circuit configured to perform signal processing.

According to the present disclosure, the deterioration of a noise figure of a low-noise amplifier can be suppressed.

DETAILED DESCRIPTION OF THE DISCLOSURE

All of FIG. 1A to FIG. 9B referred to in the following embodiments and the like are schematic figures, and ratios of sizes and thicknesses of constituent elements in the figures do not necessarily reflect actual dimensional ratios.

Embodiment 1

Hereinafter, a high-frequency module 1 and a communication device 200 according to the present embodiment will be described with reference to FIG. 1A to FIG. 3.

(1) OVERALL CONFIGURATION OF HIGH-FREQUENCY MODULE

Figure 2:
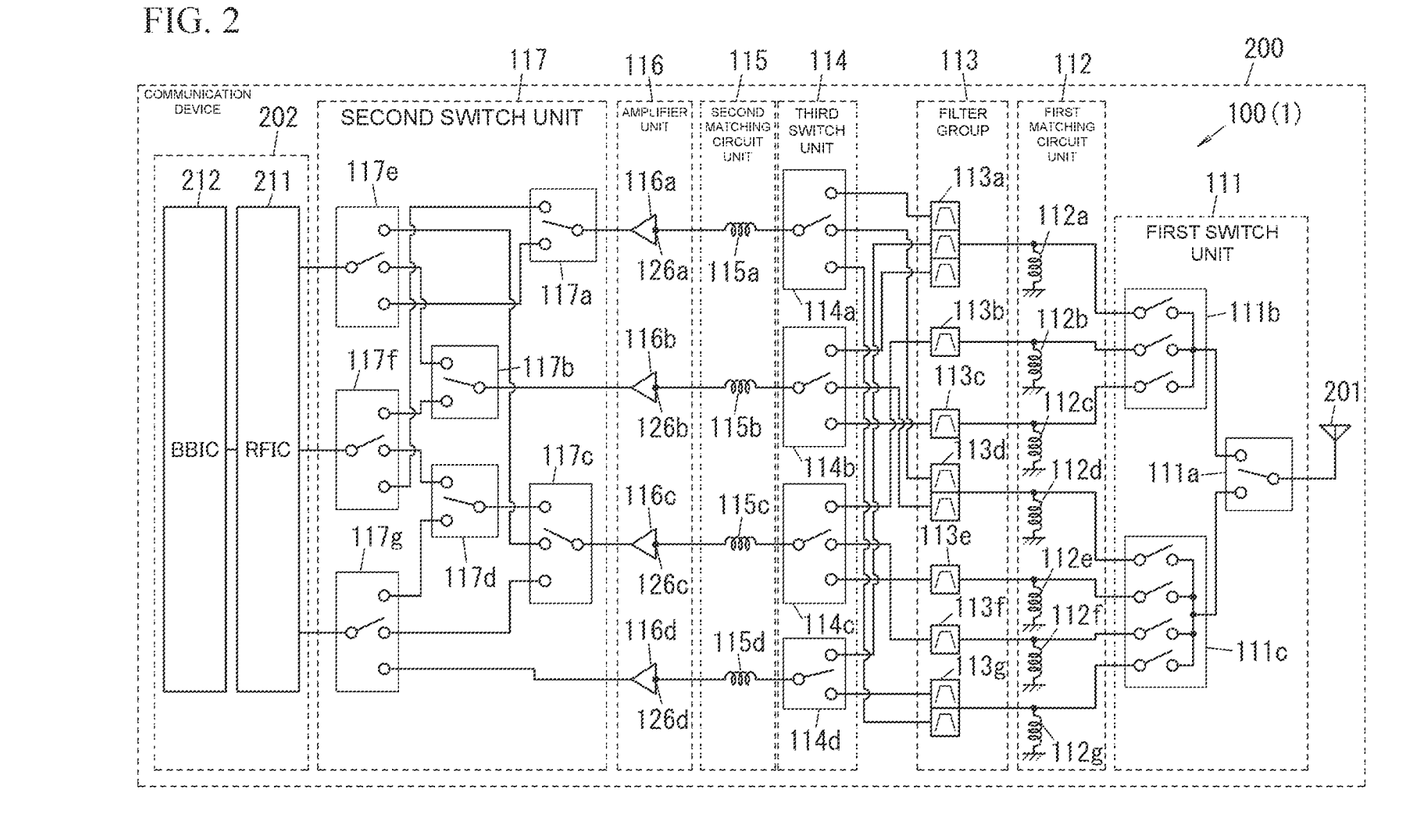
FIG. 2 is a diagram for explaining a configuration of a front-end module as a high-frequency module in an application example.

The high-frequency module 1 according to the embodiment is used in, for example, the communication device 200 supporting multi-modes/multi-bands (see FIG. 2). The communication device 200 is, for example, a cellular phone (for example, a smartphone), but is not limited thereto, and may be, for example, a wearable terminal (for example, a smartwatch) or the like.

The high-frequency module 1 is provided in the communication device 200 that conforms to communication standards such as long term evolution (LTE), and supports multi-bands. The high-frequency module 1 receives a signal by using an antenna provided in the communication device 200, performs amplification processing or the like on the received signal, and outputs the signal to a signal processing circuit 202 (see FIG. 2) that processes a high-frequency signal.

(2) EACH CONSTITUENT ELEMENT OF HIGH-FREQUENCY MODULE

Here, constituent elements of the high-frequency module 1 according to the present embodiment will be described.

Figure 1A:
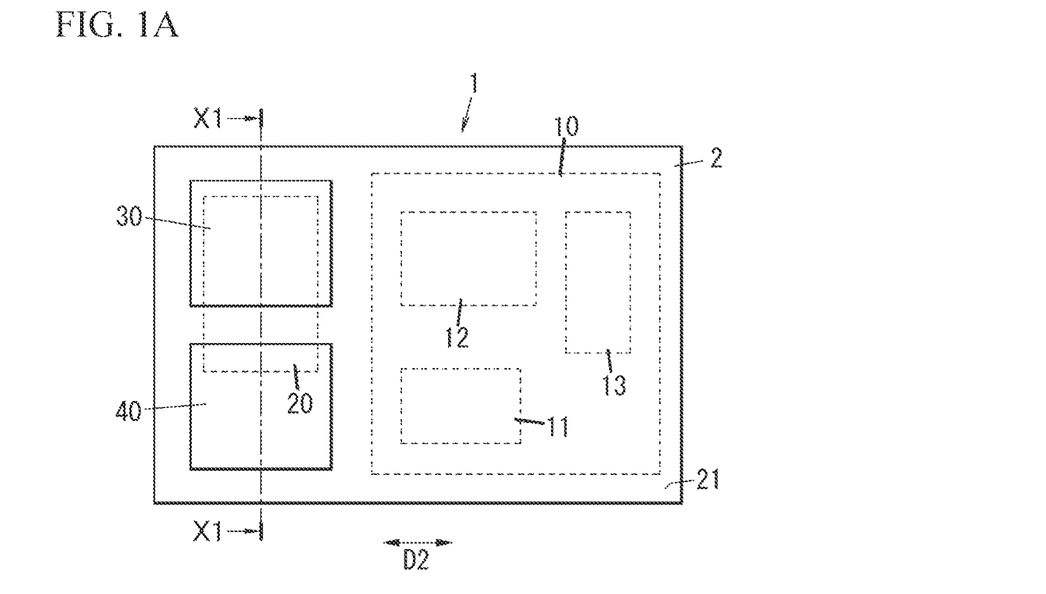
FIG. 1A is a plan view when a high-frequency module according to Embodiment 1 is viewed in plan.

The high-frequency module 1 according to the present embodiment includes, as illustrated in FIG. 1A, a mounting substrate 2, a switch integrated circuit (IC) 10, an input switch 20, a matching circuit 30, and a filter 40.

The switch IC 10 is a semiconductor element including an antenna switch 11, a low-noise amplifier 12, and an output switch 13. That is, the antenna switch 11, the low-noise amplifier 12, and the output switch 13 are integrated into one chip.

The mounting substrate 2 is a double-sided mounting substrate, and has a first main surface 21 and a second main surface 22 opposed to each other in a first direction D1, which is a thickness direction of the mounting substrate 2. Components constituting the high-frequency module 1 are provided on the first main surface 21 and the second main surface 22. For example, the matching circuit 30 and the filter 40 are provided on the first main surface 21. The switch IC 10 and the input switch 20 are provided on the second main surface 22.

The high-frequency module 1 further includes, on the first main surface 21 of the mounting substrate 2, a first resin layer 51 that covers electronic components such as a filter group 113, the matching circuit 30, and the filter 40 mounted on the first main surface 21. The high-frequency module 1 further includes, on the second main surface 22 of the mounting substrate 2, a second resin layer 52 that covers electronic components such as the switch IC 10 and the input switch 20 mounted on the second main surface 22. A material for the second resin layer 52 may be the same material as a material for the first resin layer 51, or may be a different material. Note that, in FIG. 1A, the first resin layer 51 is omitted.

Further, the high-frequency module 1 also includes a plurality of external connection electrodes 60. The plurality of external connection electrodes 60 connects the high-frequency module 1 to a mother substrate on which the signal processing circuit 202 described later and the like are mounted. The external connection electrodes 60 are columnar (for example, cylindrical) electrodes provided on the second main surface 22 of the mounting substrate 2. A material for the external connection electrodes 60 is, for example, metal (for example, copper, a copper alloy, or the like).

An input terminal of the antenna switch 11 included in the switch IC 10 is connected to, for example, an antenna 201 (see FIG. 2). Additionally, an output terminal of the antenna switch 11 is connected to an input terminal of the filter 40. When the high-frequency module 1 has a plurality of the filters 40, the antenna switch 11 has a switch that distributes signals received by the antenna 201 to signal paths corresponding to the filters 40.

The filter 40 passes a reception signal in a predetermined frequency band among reception signals received by the antenna 201. The filter 40 is, for example, an acoustic wave filter, and each of series arm resonators and parallel arm resonators is configured with an acoustic wave resonator. The acoustic wave filter is, for example, a surface acoustic wave (SAW) filter utilizing a surface acoustic wave. Note that, the filters are not limited to SAW filters. The filters may be, for example, bulk acoustic wave (BAW) filters other than SAW filters.

The input switch 20 is a switch for inputting a signal outputted from the filter 40 to the matching circuit 30. As described above, the input switch 20 is provided on the second main surface 22 of the mounting substrate 2. The input switch 20 overlaps at least a part of the filter 40, when the mounting substrate 2 is viewed in plan (see FIG. 1A). The input switch 20 and the filter 40 are connected to each other with a via 62 provided in the mounting substrate 2 interposed therebetween. For example, the via 62 is provided in a region overlapping at least a part of both the input switch 20 and the filter 40, when the mounting substrate 2 is viewed in plan (see FIG. 1B).

Figure 1B:
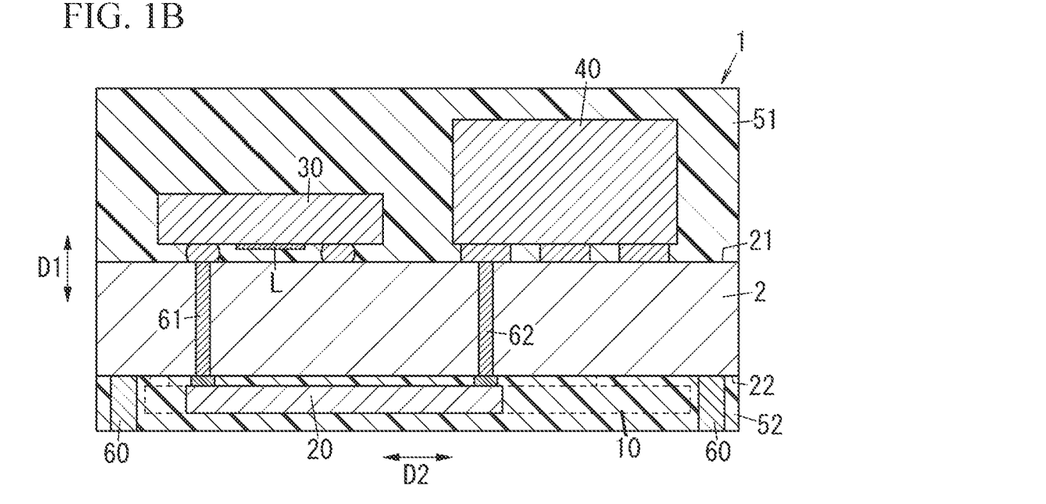
FIG. 1B is an X1-X1 sectional view of the above high-frequency module.

The matching circuit 30 has an inductor L (see FIG. 1B). The matching circuit 30 is a circuit element that performs impedance matching between the input switch 20 and the low-noise amplifier 12. The matching circuit 30 includes, for example, a substrate having a front surface and a back surface opposed to each other. The substrate is, for example, a silicon substrate. The inductor L is provided on a side of the front surface of the substrate. The input switch 20 overlaps at least a part of the matching circuit 30, when the mounting substrate 2 is viewed in plan (see FIG. 1A). The input switch 20 and the inductor L of the matching circuit 30 are connected to each other with a via 61 provided in the mounting substrate 2 interposed therebetween. For example, the via 61 is provided in a region overlapping at least a part of both the input switch 20 and the matching circuit 30, when the mounting substrate 2 is viewed in plan (see FIG. 1B). Note that, the matching circuit 30 may be, for example, a one chip integrated passive device (IPD) including a plurality of inductors and a plurality of capacitors formed on a side of the front surface of the substrate.

The low-noise amplifier 12 included in the switch IC 10 is connected to the matching circuit 30. Specifically, an input terminal of the low-noise amplifier 12 is connected to the matching circuit 30. That is, the input terminal of the low-noise amplifier 12 is connected to the input switch 20. Here, "connected" includes not only a case of direct connection without another circuit interposed therebetween, but also a case of indirect connection with another circuit interposed therebetween.

The low-noise amplifier 12 amplifies a signal after passing through the matching circuit 30. The matching circuit 30 and the low-noise amplifier 12 are disposed side by side in a second direction D2, when the mounting substrate 2 is viewed in plan (see FIG. 1A). That is, when the mounting substrate 2 is viewed in plan, the matching circuit 30 and the low-noise amplifier 12 are disposed side by side without any other elements being present therebetween.

The output switch 13 included in the switch IC 10 is connected to an RF signal processing circuit 211 (see FIG. 2) of the signal processing circuit 202. The output switch 13 outputs, a signal after passing through the low-noise amplifier 12, to the RF signal processing circuit 211.

(3) EFFECTS

In the high-frequency module 1, since the matching circuit 30 and the input switch 20 are connected to each other, a path therebetween is preferably short. Accordingly, in the present embodiment, the high-frequency module 1 includes the mounting substrate 2, the low-noise amplifier 12, the input switch 20, and the matching circuit 30. The mounting substrate 2 has the first main surface 21 and the second main surface 22 opposed to each other. The input switch 20 is connected to the input terminal of the low-noise amplifier 12. The matching circuit 30 performs impedance matching between the input switch 20 and the low-noise amplifier 12. The matching circuit 30 is disposed on the first main surface 21. The input switch 20 and the low-noise amplifier 12 are disposed on the second main surface 22. When the mounting substrate 2 is viewed in plan, the input switch 20 overlaps at least a part of the matching circuit 30. According to this configuration, since the input switch 20 overlaps at least a part of the matching circuit 30 when the mounting substrate 2 is viewed in plan, it is possible to shorten a path of a signal between the input switch 20 and the matching circuit 30. As a result, since a wiring loss is reduced, the deterioration of a noise figure of the low-noise amplifier 12 can be suppressed.

In addition, since the input switch 20 overlaps at least a part of the matching circuit 30, it is possible to reduce a mounting area of electronic components on the mounting substrate 2, and thus it is possible to reduce the high-frequency module 1 in size.

Further, since a path between the input switch and the matching circuit can be shortened, an increase in parasitic capacitance can be also prevented.

Further, in the high-frequency module 1, since the filter 40 and the input switch 20 are connected to each other, a path therebetween is preferably short. In the present embodiment, the input switch 20 is disposed so as to overlap at least a part of the filter 40, when the mounting substrate 2 is viewed in plan. According to this configuration, a path between the input switch 20 and the filter 40 can be made shortest.

In addition, since the input switch 20 is disposed so as to overlap at least a part of the filter 40 and at least a part of the matching circuit 30 when the mounting substrate 2 is viewed in plan, it is possible to reduce a mounting area of electronic components on the mounting substrate 2. As a result, the high-frequency module 1 can be reduced in size.

(4) APPLICATION EXAMPLE

The high-frequency module 1 of the present embodiment can be applied as a front-end module 100 illustrated in FIG. 2.

The front-end module 100 as the high-frequency module 1 is provided in the communication device 200. As illustrated in FIG. 2, the communication device 200 includes the front-end module 100, the antenna 201, and the signal processing circuit 202. The communication device 200 transmits and receives signals by using the antenna 201. Note that in FIG. 2, a circuit related to transmission is omitted.

First, a circuit configuration of the front-end module 100 will be described.

The front-end module 100 is disposed in, for example, a front-end unit of a cellular phone supporting multi-modes/multi-bands. The front-end module 100 is built in, for example, a cellular phone conforming to communication standards such as LTE and supporting multi-bands. The front-end module 100 has a plurality of paths (signal paths) through which high-frequency signals having frequency bands different from each other are transmitted.

As illustrated in FIG. 2, the front-end module 100 includes a first switch unit 111, a first matching circuit unit 112, the filter group 113, a third switch unit 114, a second matching circuit unit 115, an amplifier unit 116, and a second switch unit 117. The first switch unit 111, the second switch unit 117, and the amplifier unit 116 are included in a switch IC 110 (see FIG. 3). In other words, the first switch unit 111, the second switch unit 117, the third switch unit 114, and the amplifier unit 116 are integrated into one chip to configure the switch IC 110.

The signals path are paths in which signals pass through the switch IC 110, the filter group 113, the first matching circuit unit 112, and the second matching circuit unit 115. A signal flows in an order of the first switch unit 111, the third switch unit 114, the amplifier unit 116, and the second switch unit 117. Specifically, a signal passes through in an order of the first switch unit 111, the first matching circuit unit 112, the filter group 113, the third switch unit 114, the second matching circuit unit 115, the amplifier unit 116, and the second switch unit 117.

The first switch unit 111 corresponds to the antenna switch 11 described above. An input terminal of the first switch unit 111 is connected to the antenna 201.

Additionally, an output terminal of the first switch unit 111 is connected to an input terminal of the filter group 113. The first switch unit 111 has switches 111a to 111c that distribute signals received by the antenna 201 to signal paths corresponding to filters 113a to 113g constituting the filter group 113.

The first matching circuit unit 112 has, for example, inductors 112a to 112g. Each of the inductors 112a to 112g is a circuit element that performs impedance matching between the first switch unit 111 and the filter group 113. One ends of the respective inductors 112a to 112g are connected to paths, the paths connect the switches 111a to 111c of the first switch unit 111 and the filters 113a to 113g of the filter group 113, and other ends are connected to reference terminals (ground). Note that, in the first matching circuit unit 112, each of the inductors 112a to 112g may be connected in series to the path, instead of being connected between the path and the ground. Furthermore, the first matching circuit unit 112 is not necessarily be a circuit made up of the inductors 112a to 112g, but may be a circuit made up of a capacitor or a combination of an inductor and a capacitor.

The filter group 113 has the filters 113a to 113g each configured with a surface acoustic wave resonator, a bulk acoustic wave (BAW) resonator, a film bulk acoustic resonator (FBAR), or the like. Note that, the filters 113a to 113g may be each configured with an LC resonance circuit or the like. Here, the filters 113a to 113g are each configured with a surface acoustic wave resonator. Output terminals of the filter group 113 are connected to input terminals of the third switch unit 114.

The filter 113a is, for example, a triplexer in which a common terminal serves as input terminals of three respective filters. In addition, the filters 113d and 113g are, for example, each a duplexer in which a common terminal serves as input terminals of two respective filters.

The third switch unit 114 corresponds to the input switch 20 described above. The third switch unit 114 has switches 114a to 114d. An output terminal of each of the switches 114a to 114d is connected to an input terminal of the second matching circuit unit 115. To be specific, an input terminal of each of the switches 114a to 114d is connected to the filter group 113, and the output terminals of the respective switches 114a to 114d are connected to inductors 115a to 115d of the second matching circuit unit 115, respectively. Each of the switches 114a to 114d selects any of signals after passing through the filters 113a to 113g, and outputs the selected signal to the second matching circuit unit 115.

The second matching circuit unit 115 has the inductors 115a to 115d. The matching circuit 30 described above can be applied to each of the inductors 115a to 115d. Each of the inductors 115a to 115d is a circuit element that performs impedance matching between the third switch unit 114 and the amplifier unit 116. One end of each of the inductors 115a to 115d is connected to a corresponding switch among the switches 114a to 114d, and another end is connected to a corresponding amplifier circuit among amplifier circuits 116a to 116d. Note that, in the second matching circuit unit 115, each of the inductors 115a to 115d may be, instead of being disposed in series in a path connecting the third switch unit 114 and the amplifier unit 116, connected between the above path and the ground. Furthermore, the second matching circuit unit 115 is not necessarily be a circuit made up of the inductors 115a to 115g, but may be a circuit made up of a capacitor or a combination of an inductor and a capacitor.

The amplifier unit 116 has the amplifier circuits 116a to 116d. Each of the amplifier circuits 116a to 116d amplifies a signal after passing through the first switch unit 111, the first matching circuit unit 112, the filter group 113, the third switch unit 114, and the second matching circuit unit 115. Each of the amplifier circuits 116a to 116d is, for example, a low-noise amplifier. That is, the low-noise amplifier 12 described above can be applied to each of the amplifier circuits 116a to 116d. Input terminals 126a to 126d of the respective amplifier circuits 116a to 116d are connected to corresponding inductors among the inductors 115a to 115d. Output terminals of the respective amplifier circuits 116a to 116d are connected to the second switch unit 117. Here, each of the input terminals 126a to 126d corresponds to the input terminal of the low-noise amplifier 12 described above.

The second switch unit 117 corresponds to the output switch 13 described above. The second switch unit 117 is connected to the RF signal processing circuit 211 of the signal processing circuit 202. The second switch unit 117 has switches 117a to 117g that distribute signals amplified by the amplifier unit 116 to predetermined terminals of the RF signal processing circuit 211.

Note that, the connection of each of the switches 111a to 111c included in the first switch unit 111, the switches 117a to 117g included in the second switch unit 117, and the switches 114a to 114d included in the third switch unit 114 is switched by a control unit (not illustrated) included in the front-end module 100.

The switches 111a to 111c, the switches 114a to 114d, and the switches 117a to 117g are field effect transistor (FET) switches made of GaAs or a complementary metal oxide semiconductor (CMOS), or diode switches.

Figure 3:
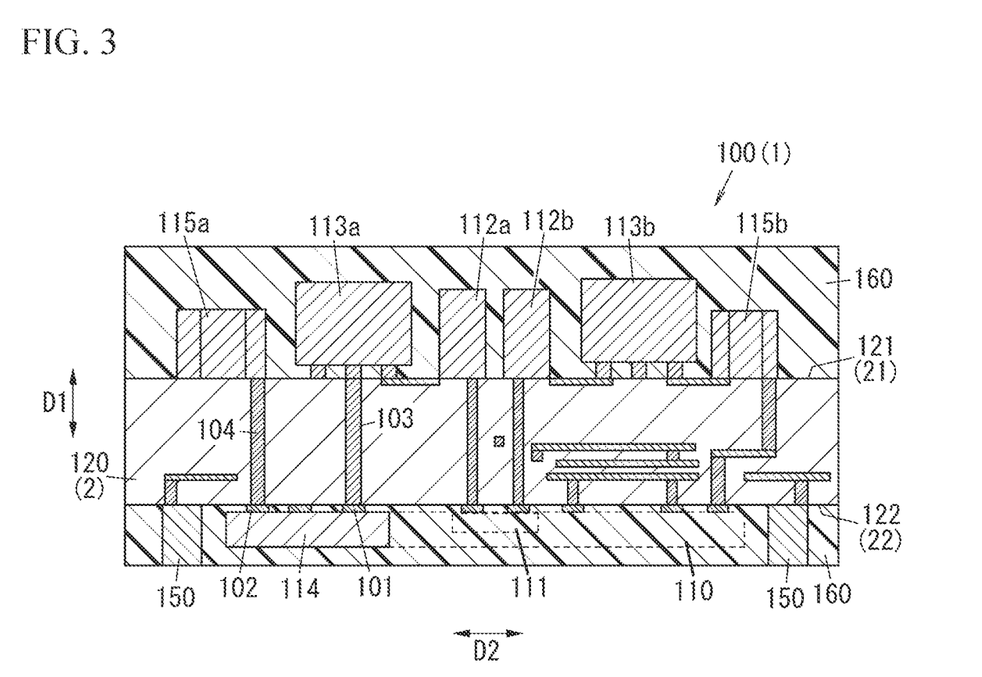
FIG. 3 is a sectional view for explaining the above front-end module.

FIG. 3 illustrates a sectional view of the front-end module 100 as the high-frequency module 1. The front-end module 100 has a mounting substrate 120 corresponding to the above-described mounting substrate 2. The mounting substrate 120 (2) has a first main surface 121 (21) and a second main surface 122 (22) opposed to each other with respect to the first direction D1, which is a thickness direction of the mounting substrate 120. The first matching circuit unit 112, the filter group 113, and the second matching circuit unit 115 are provided on the first main surface 121. The switch IC 110 and the third switch unit 114 (input switch) are provided on the second main surface 122. The first matching circuit unit 112, the filter group 113, and the second matching circuit unit 115 are sealed with a resin 160 provided on the first main surface 121. On the second main surface 122, the switch IC 110 and the third switch unit 114 are sealed with the resin 160 provided on the second main surface 122. The resin 160 provided on the first main surface 121 corresponds to the first resin layer 51 described above, and the resin 160 provided on the second main surface 122 corresponds to the second resin layer 52 described above.

The front-end module 100 further has a plurality of electrodes 150 (see FIG. 3). The plurality of electrodes 150 is provided on the second main surface 122. The electrodes 150 are disposed, on the second main surface 122, around the switch IC 110 and the third switch unit 114. The first switch unit 111 of the switch IC 110 receives a high-frequency signal by using the electrode 150. Note that, the plurality of electrodes 150 may be copper pillar (copper pin) electrodes, plated electrodes, copper paste electrodes, or other such electrodes, solder, or the like. The plurality of electrodes 150 corresponds to the plurality of external connection electrodes 60 described above.

Also in the front-end module 100, when the mounting substrate 120 is seen from the first direction D1, that is, when the mounting substrate 120 is viewed in plan, the third switch unit 114 overlaps at least a part of the filter 113a (see FIG. 3). Further, when the mounting substrate 120 is viewed in plan, the third switch unit 114 overlaps at least a part of the inductor 115a of the second matching circuit unit 115 (see FIG. 3).

In the front-end module 100, the filter 113a and the inductor 115a corresponding thereto are disposed so as to be adjacent to each other in the second direction D2 (see FIG. 3). Here, "adjacent" means that there is no other element between the filter and the matching circuit.

For example, an input terminal 101 of the third switch unit 114 is connected to the filter 113a with a via 103 interposed therebetween. An output terminal 102 of the third switch unit 114 is connected to the inductor 115a of the second matching circuit unit 115 with a via 104 interposed therebetween.

Here, the via 103 corresponds to the above-described via 62, and is provided in a region overlapping at least a part of both the third switch unit 114 and the filter 113a, when the mounting substrate 2 is viewed in plan (see FIG. 3). The via 104 corresponds to the above-described via 61, and is provided in a region overlapping at least a part of both the third switch unit 114 and the inductor 115a, when the mounting substrate 2 is viewed in plan (see FIG. 3).

The signal processing circuit 202 includes, for example, the RF signal processing circuit 211 and a baseband signal processing circuit 212. The RF signal processing circuit 211 is, for example, a radio frequency integrated circuit (RFIC), and performs signal processing on a high-frequency signal. The baseband signal processing circuit 212 is, for example, a baseband integrated circuit (BBIC), and performs predetermined signal processing. A reception signal processed by the baseband signal processing circuit 212 is used, for example, for image display as an image signal, or for a call as an audio signal. The front-end module 100 transmits a high-frequency signal (here, a reception signal) between the antenna 201 and the RF signal processing circuit 211 of the signal processing circuit 202. In the communication device 200, the baseband signal processing circuit 212 is not an essential constituent element.

As described above, the high-frequency module 1 of the embodiment can be applied as the front-end module 100. In the communication device 200 including the front-end module 100 as the high-frequency module 1, it is possible to shorten a path between the third switch unit 114 as the input switch 20, and each of the inductors 115a to 115d as the matching circuit 30. As a result, the deterioration of a noise figure of the low-noise amplifier 12 can be suppressed.

Note that, although the front-end module 100 of a reception system that receives a signal from the antenna 201 and outputs the received signal to the RF signal processing circuit 211 has been illustrated here, the front-end module according to the present disclosure can also be applied to a front-end module of a transmission system that receives a high-frequency transmission signal outputted from the RF signal processing circuit 211 and outputs the signal to an antenna or the like. In this case, the amplifier circuits 116a to 116d may be, for example, power amplifiers that amplify transmission signals, instead of low-noise amplifiers. Further, a transmission signal flows in an order of the second switch unit 117, the amplifier unit 116, the second matching circuit unit 115, the third switch unit 114, the filter group 113, the first matching circuit unit 112, and the first switch unit 111.

Note that, it is not mandatory that the first switch unit 111, the second switch unit 117, and the amplifier unit 116 are integrated into one chip. The first switch unit 111, the second switch unit 117, and the amplifier unit 116 may be individually disposed on the second main surface 122.

(5) MODIFICATION EXAMPLES

Hereinafter, modification examples of Embodiment 1 will be described.

(5.1) Modification Example 1

Figure 4:
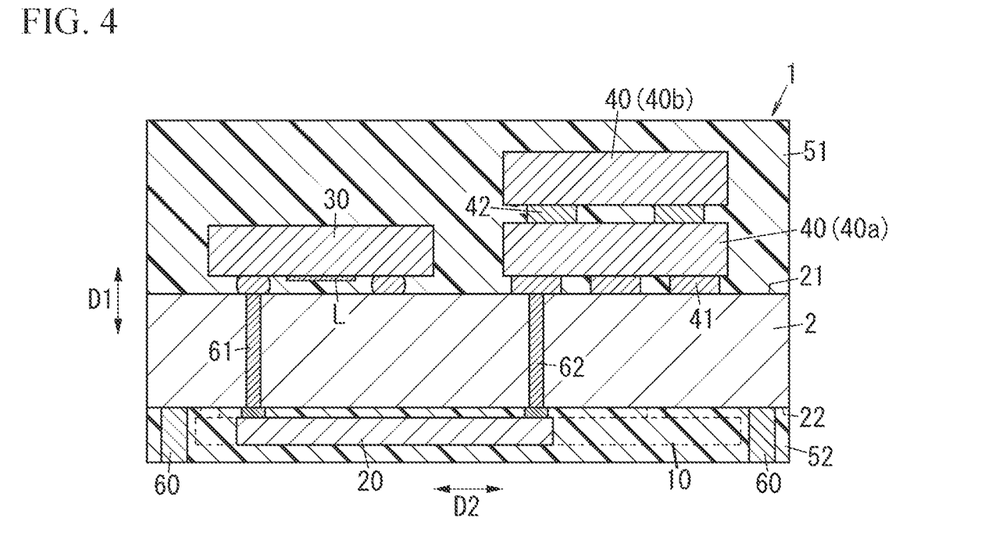
FIG. 4 is a sectional view of a high-frequency module according to Modification Example 1 of Embodiment 1.

In the present modification example, two the filters 40 (filters 40a and 40b) are disposed next to each other in the first direction D1 (see FIG. 4). In the present modification example, the filter 40a and the filter 40b are disposed (laminated) in this order in the first direction D1 with respect to the mounting substrate 2. In other words, when the mounting substrate 2 is viewed in plan, the filter 40a and the filter 40b overlap each other.

The filter 40a is connected to the first main surface 21 of the mounting substrate 2 with a plurality of terminals 41 interposed therebetween. The filter 40b is connected to the filter 40a with a plurality of terminals 42 interposed therebetween, and is connected to the mounting substrate 2 with the filter 40a interposed therebetween. Here, the terminals 41 and the terminals 42 are, for example, bumps. Each bump is, for example, a solder bump. Each bump is not limited to a solder bump, and may be, for example, a gold bump. The filter 40a is connected to the input switch 20 with the via 62 interposed therebetween.

For example, when the high-frequency module 1 is applied to carrier-aggregation communication, the filter 40a and the filter 40b may be filters that are used together during simultaneous communication, or filters that are not used simultaneously during simultaneous communication.

(5.2) Modification Example 2

In Embodiment 1, although the configuration has been adopted in which the switch IC 10 is provided on the second main surface 22 of the mounting substrate 2, the present disclosure is not limited to this configuration. The switch IC 10 may be provided on the first main surface 21 of the mounting substrate 2.

Also in this case, a path can be made shortest, in each of between the filter 40 and the input switch 20, and between the matching circuit 30 and the input switch 20. As a result, the deterioration of a noise figure of the low-noise amplifier 12 can be suppressed. In this case, the mounting substrate 2 need not be a double-sided mounting substrate.

(5.3) Modification Example 3

It is not mandatory that the antenna switch 11, the low-noise amplifier 12, and the output switch 13 are integrated into one chip. The antenna switch 11, the low-noise amplifier 12, and the output switch 13 may be individually disposed on the second main surface 22.

(5.4) Modification Example 4

In the high-frequency module 1 according to Embodiment 1, as illustrated in FIG. 1B, on a side of the second main surface 22 of the mounting substrate 2, the second resin layer 52 is provided so as to cover the switch IC 10 mounted on the second main surface 22. Further, the high-frequency module 1 includes the external connection electrodes 60 each formed in a cylindrical shape, and is connected to the mother substrate with these external connection electrodes 60.

Figure 5:
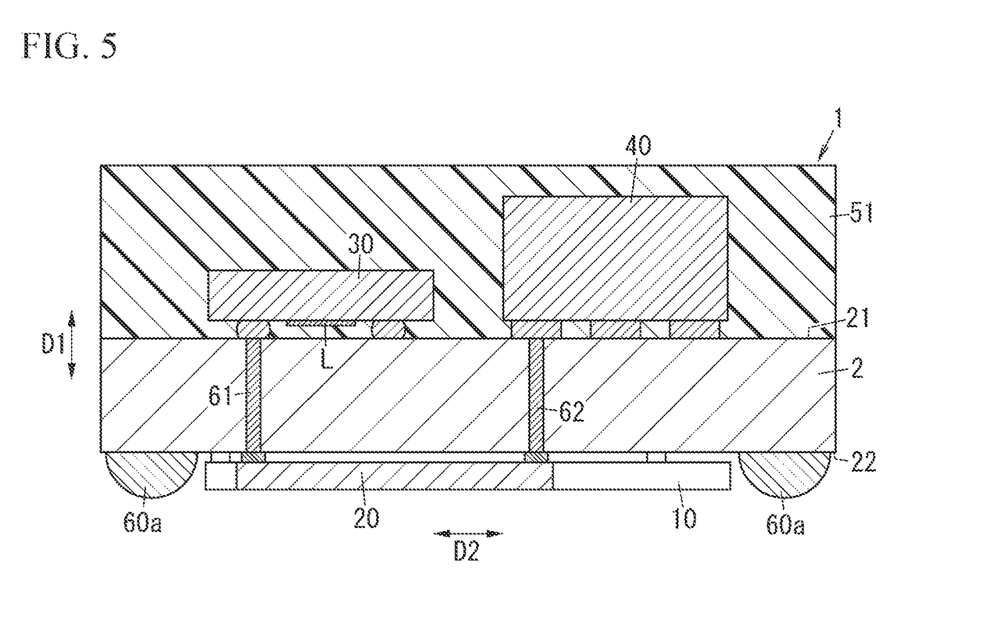
FIG. 5 is a sectional view of a high-frequency module according to Modification Example 4 of Embodiment 1.

Compared to this, as illustrated in FIG. 5, the second resin layer may be omitted on the second main surface 22 side of the mounting substrate 2, and the mounting substrate 2 may be connected to the mother substrate with external connection electrodes 60a each formed in a spherical shape.

Each of the external connection electrodes 60a is, for example, a ball bump formed in a spherical shape. A material for the ball bump is, for example, gold, copper, solder, or the like.

Embodiment 2

A high-frequency module 1A according to Embodiment 2 is different from Embodiment 1 in disposition of the input switch 20 included in the high-frequency module 1A. Differences from Embodiment 1 will be mainly described below. Note that, similar constituent elements to those in Embodiment 1 are assigned with the same reference numerals, and description thereof will be appropriately omitted.

(1) EACH CONSTITUENT ELEMENT OF HIGH-FREQUENCY MODULE

Figure 6A:
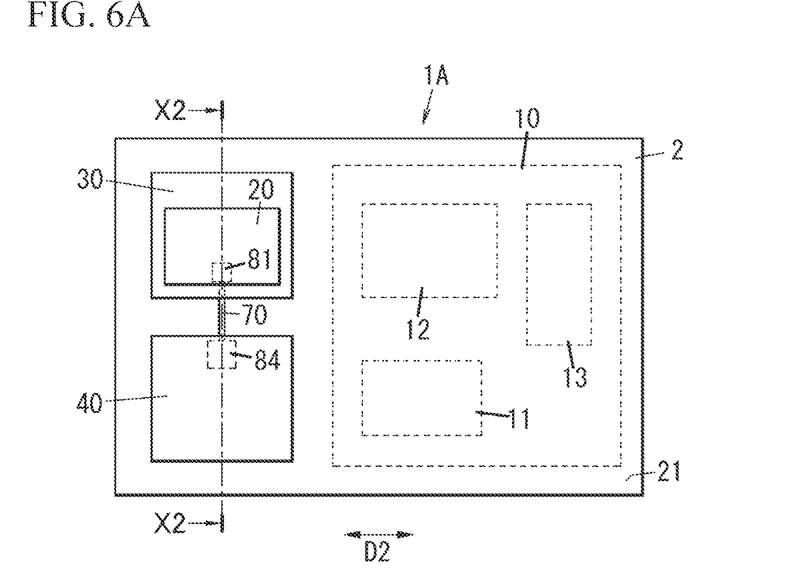
FIG. 6A is a plan view when a high-frequency module according to Embodiment 2 is viewed in plan.

The high-frequency module 1A of the present embodiment includes, as illustrated in FIG. 6A, the mounting substrate 2, the switch IC 10, the input switch 20, the matching circuit 30, and the filter 40. The switch IC 10 includes the antenna switch 11, the low-noise amplifier 12, and the output switch 13. Note that in FIG. 6A, the first resin layer 51 is omitted.

The matching circuit 30, the filter 40, and the input switch 20 are provided on or above the first main surface 21 of the mounting substrate 2. The switch IC 10 is provided on the second main surface 22.

The input switch 20 is a switch for inputting a signal outputted from the filter 40 to the matching circuit 30. As described above, the input switch 20 is provided on the first main surface 21 of the mounting substrate 2.

Figure 6B:
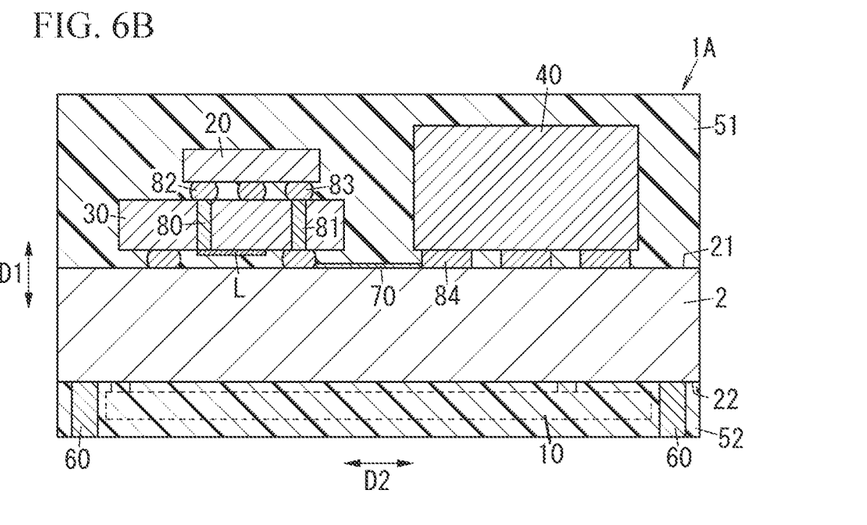
FIG. 6B is an X2-X2 sectional view of the above high-frequency module.

The input switch 20 overlaps at least a part of the matching circuit 30, when the mounting substrate 2 is viewed in plan (see FIG. 6A and FIG. 6B). To be specific, the matching circuit 30 and the input switch 20 are disposed (laminated) in this order in the first direction D1 with respect to the mounting substrate 2. The input switch 20 and the matching circuit 30 are connected to each other with a through-silicon via (TSV) 80 interposed therebetween. To be specific, an output terminal 82 of the input switch 20 is connected to the inductor L of the matching circuit 30 with the TSV 80 interposed therebetween. With this configuration, a path between the input switch 20 and the matching circuit 30 can be shortened. As a result, the deterioration of a noise figure of the low-noise amplifier 12 can be suppressed.

Note that, in the present embodiment, a configuration is adopted in which the input switch 20 and the inductor L of the matching circuit 30 are connected to each other with the TSV 80 interposed therebetween. However, the present disclosure is not limited to this configuration. A case also belongs to the technical scope of the present disclosure, where the input switch 20 and the inductor L of the matching circuit 30 are connected, with a conductor pattern interposed therebetween, which is provided on a substrate of the matching circuit 30.

The input switch 20 is disposed so as to be adjacent to the filter 40, when the mounting substrate 2 is viewed in plan. Further, an output terminal 84 of the filter 40 and an input terminal 83 of the input switch 20 are disposed such that a distance between the output terminal 84 and the input terminal 83 is short, when the mounting substrate 2 is viewed in plan. The input terminal 83 of the input switch 20 is connected to the output terminal 84 of the filter 40, with a via 81 provided in the matching circuit 30 and a conductor 70 provided on the first main surface 21, interposed therebetween. Since the via 81 and the conductor 70 are interposed, a path between the input switch 20 and the filter 40 can be shortened.

Thus, with the above configuration, in the high-frequency module 1A of the present embodiment, a path of a received signal can be shortened. Furthermore, by shortening the path of a received signal, an increase in parasitic capacitance can be prevented.

In addition, since the input switch 20 is disposed so as to overlap at least a part of the matching circuit 30 when the mounting substrate 2 is viewed in plan, it is possible to reduce a mounting area of electronic components on the mounting substrate 2. As a result, the high-frequency module 1A can be reduced in size.

Note that, the high-frequency module 1A of the present embodiment can be applied to the front-end module 100 described in Embodiment 1.

(2) MODIFICATION EXAMPLES

Hereinafter, modification examples of the present embodiment will be described.

(2.1) Modification Example 1

A high-frequency module 1B according to Modification Example 1 is different from the high-frequency module 1A in that the input switch 20 and the filter 40 are connected by wire bonding. To be specific, in the high-frequency module 1B of Modification Example 1, the input terminal 83 of the input switch 20 and the output terminal 84 of the filter 40 are connected to each other by wire bonding using a wire 71 (see FIG. 7A). Also in this case, a path between the input switch 20 and the filter 40 can be shortened. Furthermore, an increase in parasitic capacitance can be prevented.

Note that, the high-frequency module 1B of the present embodiment can be applied to the front-end module 100 described in Embodiment 1.

(2.2) Modification Example 2

In a high-frequency module 1C according to Modification Example 2, a connection destination of a wire is different from that of the high-frequency module 1B. To be specific, in the high-frequency module 1C of Modification Example 2, a wiring layer provided in an upper part of the input switch 20 or provided above the input switch 20 and (the output terminal 84 of) the filter 40 are connected to each other by wire bonding using a wire 72 (see FIG. 7B). Also in this case, a path between the input switch 20 and the filter 40 can be shortened. Furthermore, an increase in parasitic capacitance can be prevented.

Note that, the high-frequency module 1C of the present embodiment can be applied to the front-end module 100 described in Embodiment 1.

(2.3) Modification Example 3

A high-frequency module 1D according to Modification Example 3 is different from the high-frequency modules 1B and 1C, when a plurality of filters is provided, in disposition of the filters, and a connection destination of a wire. To be specific, in the high-frequency module 1D, as with Modification Example 1 of Embodiment 1, the plurality of filters 40 (two in the illustrated example) (filters 40a and 40b) is disposed next to each other in the first direction D1 (see FIG. 7C). In the present modification example, the filter 40a and the filter 40b are disposed (laminated) in this order in the first direction D1 with respect to the mounting substrate 2. In other words, when the mounting substrate 2 is viewed in plan, the filter 40a and the filter 40b overlap each other. When the filter 40b and the input switch 20 are connected to each other, an output terminal 85 of the filter 40b and the input terminal 83 of the input switch 20 are connected to each other by wire bonding using a wire 73 (see FIG. 7C). Note that, as in Modification Example 2, a wiring layer provided in an upper part of the input switch 20 or provided above the input switch 20 and the filter 40b may be connected by wire bonding using the wire 72.

Figure 7A:
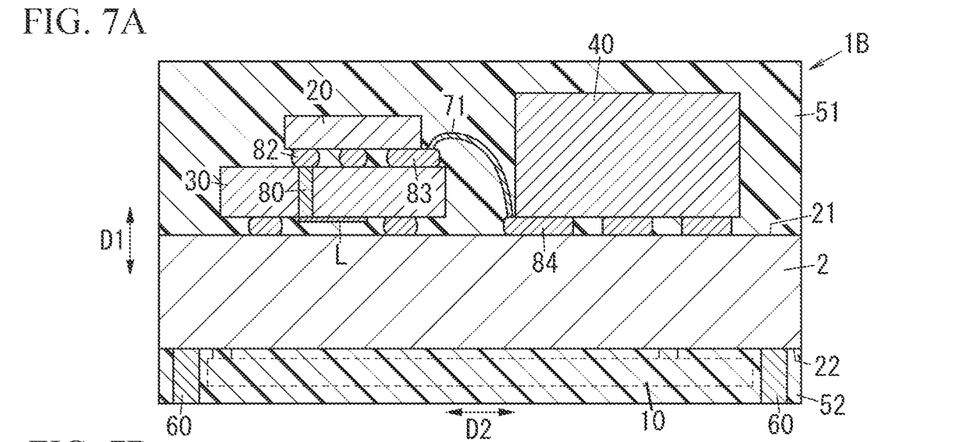
FIG. 7A is a sectional view of a high-frequency module according to Modification Example 1 of Embodiment 2.
Figure 7B:
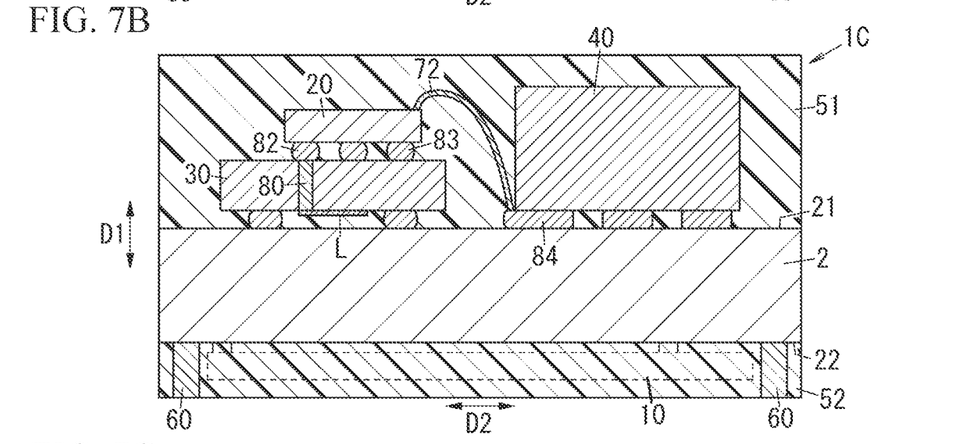
FIG. 7B is a sectional view of a high-frequency module according to Modification Example 2 of Embodiment 2.
Figure 7C:
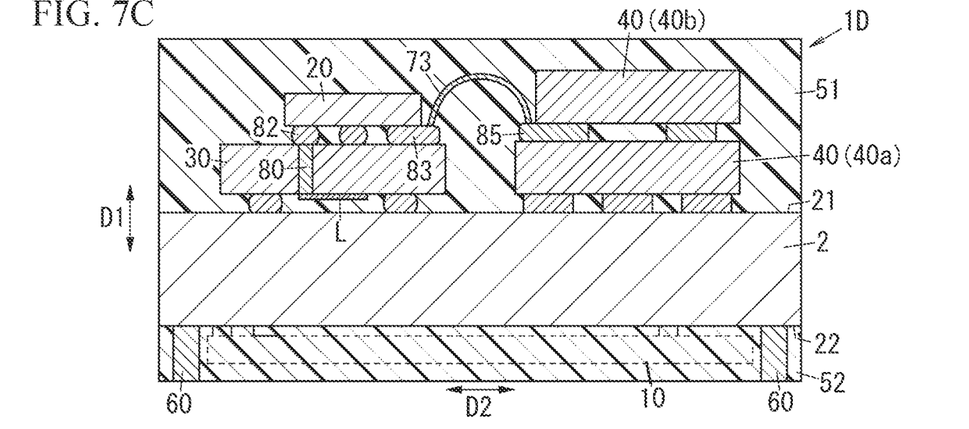
FIG. 7C is a sectional view of a high-frequency module according to Modification Example 3 of Embodiment 2.

Also in the present modification example, a path between the input switch 20 and the filter 40b can be shortened. Furthermore, an increase in parasitic capacitance can be prevented.

For example, when the high-frequency module 1 is applied to carrier-aggregation communication, the filter 40a and the filter 40b may be filters that are used together during simultaneously communication, or filters that are not used simultaneously during simultaneous communication.

Note that, the high-frequency module 1D of the present embodiment can be applied to the front-end module 100 described in Embodiment 1.

(2.4) Modification Example 4

In Modification Example 3 of Embodiment 2, the configuration has been adopted in which the input switch 20 and the filter 40b are connected to each other, but the present disclosure is not limited thereto. The input switch 20 may be connected to the filter 40a. The input switch 20 and the filter 40a may be connected by wire bonding using a wire, or may be connected using a conductor provided on the mounting substrate 2.

(2.5) Modification Example 5

A high-frequency module 1E according to Modification Example 5 is different from the high-frequency module 1A according to Embodiment 2 in disposition of the antenna switch 11, the low-noise amplifier 12, and the output switch 13 included in the switch IC 10.

In the high-frequency module 1E of the present modification example, the matching circuit 30, the filter 40, and the input switch 20 are provided on or above the first main surface 21 of the mounting substrate 2, and the switch IC 10 is provided on the second main surface 22 of the mounting substrate 2.

Figure 8A:
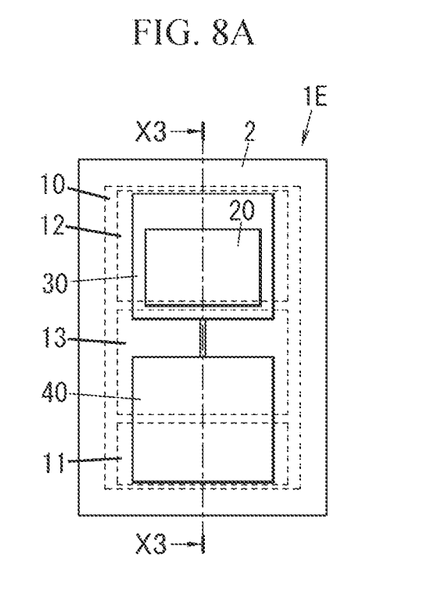
FIG. 8A is a plan view of a high-frequency module according to Modification Example 5 of Embodiment 2.

When the mounting substrate 2 is viewed in plan, at least one of the input switch 20 and the matching circuit 30 overlaps at least a part of the switch IC 10 (see FIG. 8A). In other words, when the mounting substrate 2 is viewed in plan, any of the antenna switch 11, the output switch 13, and the low-noise amplifier 12 included in the switch IC 10 overlaps at least a part of at least one of the input switch 20 and the matching circuit 30. To be specific, when the mounting substrate 2 is viewed in plan, at least the low-noise amplifier 12 among the antenna switch 11, the output switch 13, and the low-noise amplifier 12 overlaps at least one of the matching circuit 30 and the input switch 20 when the mounting substrate 2 is viewed in plan (see FIG. 8A, FIG. 8B, and FIG. 8C). Note that, the first resin layer 51 is omitted in FIG. 8A, and the second resin layer 52 is omitted in FIG. 8B.

Figure 8B:
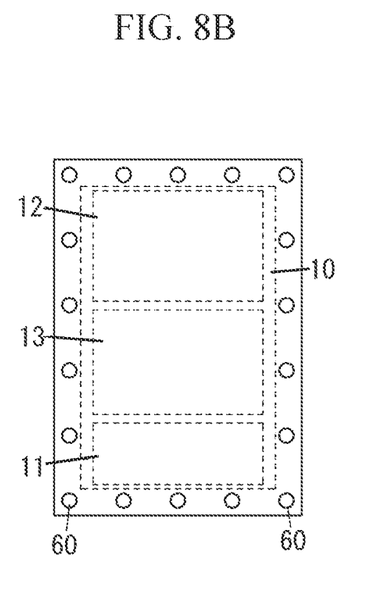
FIG. 8B is a bottom view of the above high-frequency module.
Figure 8C:
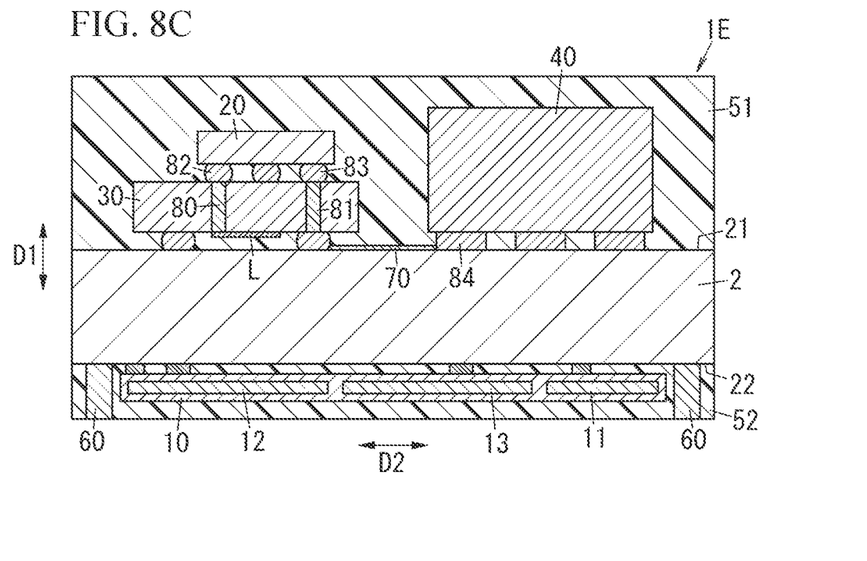
FIG. 8C is an X3-X3 sectional view of the above high-frequency module.

Further, the output switch 13 and the low-noise amplifier 12 are disposed so as to be adjacent to each other (see FIG. 8A, FIG. 8B, and FIG. 8C).

According to this configuration, a path from the input switch 20 to the low-noise amplifier 12 can be shortened. As a result, the deterioration of a noise figure of the low-noise amplifier 12 can be suppressed. Furthermore, an increase in parasitic capacitance can be prevented.

In addition, since at least one of the input switch 20 and the matching circuit 30 is disposed so as to overlap at least a part of the switch IC 10 when the mounting substrate 2 is viewed in plan, it is possible to reduce a mounting area of electronic components on the mounting substrate 2. As a result, the high-frequency module 1E can be reduced in size.

Note that, the high-frequency module 1E of the present embodiment can be applied to the front-end module 100 described in Embodiment 1. Further, the high-frequency module 1E of the present modification example can also be applied to Modification Examples 1 to 4 of Embodiment 2.

Embodiment 3

A high-frequency module 1F of the present embodiment is different from Embodiments 1 and 2 in disposition of the input switch 20. Hereinafter, differences from Embodiments 1 and 2 will be mainly described. Note that, similar constituent elements to those in Embodiments 1 and 2 are assigned with the same reference numerals, and description thereof will be appropriately omitted.

Figure 9A:
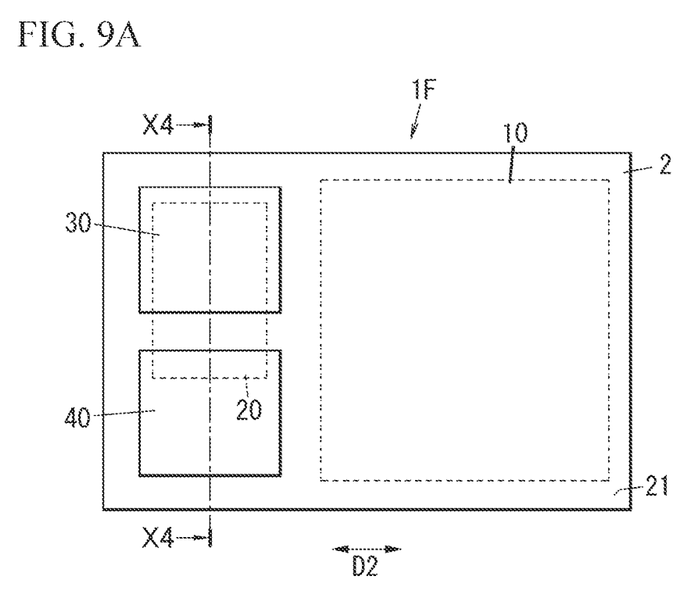
FIG. 9A is a plan view when a high-frequency module according to Embodiment 3 is viewed in plan.

The high-frequency module 1F of the present embodiment includes, as illustrated in FIG. 9A, the mounting substrate 2, the switch IC 10, the input switch 20, the matching circuit 30, and the filter 40. Note that in FIG. 9A, the first resin layer 51 is omitted.

The switch IC 10 is a semiconductor element including an antenna switch 11, a low-noise amplifier 12, and an output switch 13.

The mounting substrate 2 is a double-sided mounting substrate, and has the first main surface 21 and the second main surface 22 opposed to each other in the first direction D1, which is a thickness direction of the mounting substrate 2. Components constituting the high-frequency module 1 are provided on the first main surface 21 and the second main surface 22. For example, the matching circuit 30 and the filter 40 are provided on the first main surface 21. The switch IC 10 is provided on the second main surface 22. The input switch 20 is provided inside the mounting substrate 2. That is, the mounting substrate 2 is a substrate of an interposer.

The input switch 20 is a switch for inputting a signal outputted from the filter 40 to the matching circuit 30. The input switch 20 is built in the mounting substrate 2. The input switch 20 overlaps at least a part of the filter 40 when the mounting substrate 2 is viewed in plan (see FIG. 9A). The input switch 20 and the filter 40 are connected to each other with a via 64 provided in the mounting substrate 2 interposed therebetween. For example, the via 64 is provided in a region overlapping at least a part of both the input switch 20 and the filter 40 when the mounting substrate 2 is viewed in plan (see FIG. 9B).

Figure 9B:
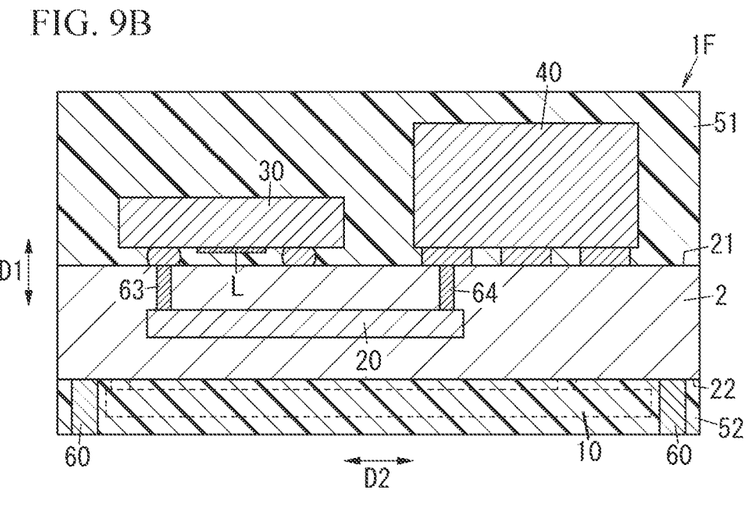
FIG. 9B is an X4-X4 sectional view of the above high-frequency module.

The matching circuit 30 includes the inductor L (see FIG. 9B). The matching circuit 30 is a circuit element that performs impedance matching between the input switch 20 and the low-noise amplifier 12. The matching circuit 30 includes, for example, a substrate having a front surface and a back surface opposed to each other. The substrate is, for example, a silicon substrate. The inductor L is provided on a side of the front surface of the substrate. The input switch 20 overlaps at least a part of the matching circuit 30 when the mounting substrate 2 is viewed in plan (see FIG. 9A). The input switch 20 and the inductor L of the matching circuit 30 are connected to each other with the via 61 provided in the mounting substrate 2 interposed therebetween. For example, the via 61 is provided in a region overlapping at least a part of both the input switch 20 and the matching circuit 30 when the mounting substrate 2 is viewed in plan (see FIG. 9B).

In the present embodiment, the input switch 20 is disposed so as to overlap at least a part of the matching circuit 30 when the mounting substrate 2 is viewed in plan. Further, when the mounting substrate 2 is viewed in plan, the via 61 is provided in a region overlapping both the input switch 20 and the matching circuit 30. Thus, also in the present embodiment, as with Embodiment 1, a path between the input switch 20 and the matching circuit 30 can be made shortest. As a result, the deterioration of a noise figure of the low-noise amplifier 12 can be suppressed.

In addition, in the present embodiment, the input switch 20 is disposed so as to overlap at least a part of the filter 40 when the mounting substrate 2 is viewed in plan. Further, the via 62 is provided in a region overlapping both the input switch 20 and the filter 40, when the mounting substrate 2 is viewed in plan. Thus, also in the present embodiment, as with Embodiment 1, a path between the filter 40 and the input switch 20 can be made shortest.

Furthermore, an increase in parasitic capacitance can be prevented.

In addition, since the input switch 20 is disposed so as to overlap at least a part of the filter 40, and at least a part of the matching circuit 30 when the mounting substrate 2 is viewed in plan, it is possible to reduce a mounting area of electronic components on the mounting substrate 2. As a result, the high-frequency module 1 can be reduced in size.

Note that, the high-frequency module 1F of the present embodiment can be applied to the front-end module 100 described in Embodiment 1.

Further, the high-frequency module 1F of the present embodiment can also be applied to the high-frequency module 1A.

Note that, the configuration has been adopted in which the matching circuit 30 is provided on the first main surface 21 and the input switch 20 is provided inside the mounting substrate 2 in the present embodiment, but the present disclosure is not limited to this configuration. The input switch 20 may be provided on the first main surface 21, and the matching circuit 30 may be provided inside the mounting substrate 2.

(Summary)

As described above, the high-frequency module (1) of a first aspect includes the mounting substrate (2), the low-noise amplifier (12), the input switch (20), and the matching circuit (30). The mounting substrate (2) has the first main surface (21) and the second main surface (22) opposed to each other. The input switch (20) is connected to an input terminal of the low-noise amplifier (12). The matching circuit (30) performs impedance matching between the input switch (20) and the low-noise amplifier (12). The matching circuit (30) is disposed on the first main surface (21). The input switch (20) and the low-noise amplifier (12) are disposed on the second main surface (22). When the mounting substrate (2) is viewed in plan, the input switch (20) overlaps at least a part of the matching circuit (30).

According to this configuration, a path between the input switch (20) and the matching circuit (30) can be made shortest. As a result, since a wiring loss is reduced, the deterioration of a noise figure of the low-noise amplifier (12) can be suppressed. In addition, since each input switch (20) is disposed so as to overlap at least a part of the matching circuit (30), it is possible to reduce a mounting area of electronic components on the mounting substrate (2). As a result, the high-frequency module (1) can be reduced in size.

The high-frequency module (1A; 1B; 1C; 1D; 1E) of a second aspect includes the mounting substrate (2), the low-noise amplifier (12), the input switch (20), and the matching circuit (30). The mounting substrate (2) has the first main surface (21) and the second main surface (22) opposed to each other. The input switch (20) is connected to an input terminal of the low-noise amplifier (12). The matching circuit (30) performs impedance matching between the input switch (20) and the low-noise amplifier (12). The input switch (20) and the matching circuit (30) are disposed on or above the first main surface (21). The low-noise amplifier (12) is disposed on the second main surface (22). When the mounting substrate (2) is viewed in plan, the matching circuit (30) and the input switch (20) overlap each other.

According to this configuration, a path between the input switch (20) and the matching circuit (30) can be made shortest. As a result, since a wiring loss is reduced, the deterioration of a noise figure of the low-noise amplifier (12) can be suppressed.

The high-frequency module (1F) of a third aspect includes the mounting substrate (2), the low-noise amplifier (12), the input switch (20), and the matching circuit (30). The input switch (20) is connected to an input terminal of the low-noise amplifier (12). The matching circuit (30) performs impedance matching between the input switch (20) and the low-noise amplifier (12). One of the matching circuit (30) and the input switch (20) is disposed on a main surface (the first main surface 21) of the mounting substrate (2), and another is built in the mounting substrate (2). When the mounting substrate (2) is viewed in plan, the input switch (20) overlaps at least a part of the matching circuit (30).

According to this configuration, a path between the input switch (20) and the matching circuit (30) can be made shortest. As a result, since a wiring loss is reduced, the deterioration of a noise figure of the low-noise amplifier (12) can be suppressed.

The high-frequency module (1) of a fourth aspect further includes the filter (40) disposed on the first main surface (21), in the first aspect. When the mounting substrate (2) is viewed in plan, the input switch (20) overlaps at least a part of the filter (40).

According to this configuration, the high-frequency module (1) can be reduced in size. Furthermore, a path between the filter (40) and the input switch (20) can also be shortened.

The high-frequency module (1) of a fifth aspect further includes a second filter (for example, the filter 40b) different from a first filter (for example, the filter 40a) as the filter (40) disposed on the first main surface (21), in the fourth aspect. The first filter and the second filter overlap each other, when the mounting substrate (2) is viewed in plan.

According to this configuration, the high-frequency module (1) can be reduced in size.

The high-frequency module (1) of a sixth aspect further includes the antenna switch (11) and the output switch (13), in any one of the first, fourth, and fifth aspects. The antenna switch (11) and the output switch (13) are provided on the second main surface (22).

According to this configuration, the high-frequency module (1) can be reduced in size.

In the high-frequency module (1A; 1B; 1C; 1D; 1E) of a seventh aspect, the matching circuit (30) and the input switch (20) are disposed in this order in a thickness direction (the first direction D1) of the mounting substrate (2), with respect to the mounting substrate (2), in the second aspect.

According to this configuration, by laminating the matching circuit (30) and the input switch (20), it is possible to reduce a mounting area of electronic components on the mounting substrate. As a result, the high-frequency module (1) can be reduced in size.

In the high-frequency module (1A; 1B; 1C; 1D; 1E) of an eighth aspect, the matching circuit (30) and the input switch (20) are connected to each other with the through-silicon via (80) interposed therebetween, in the seventh aspect.

According to this configuration, a path between the matching circuit (30) and the input switch (20) can be shortened.

The high-frequency module (1A; 1B; 1C; 1D; 1E) of a ninth aspect further includes the filter (40) disposed on the first main surface (21), in any one of the second, seventh, and eighth aspects. The filter (40) is provided on the first main surface (21) so as to be adjacent to the matching circuit (30) and the input switch (20).

According to this configuration, a path between the matching circuit (30) and the input switch (20) can be shortened.

In the high-frequency module (1B; 1C; 1D) of a tenth aspect, the filter (40) is connected to the input switch (20) by wire bonding, in the ninth aspect.

According to this configuration, a path between the filter (40) and the input switch (20) can be shortened.

The high-frequency module (1A; 1B; 1C; 1D; 1E) according to an eleventh aspect further includes a second filter (for example, the filter 40a) that is disposed on the first main surface (21) and different from a first filter (for example, the filter 40b) as the filter (40), in the ninth or tenth aspect. The first filter and the second filter are disposed in an order of the second filter and the first filter, with respect to the mounting substrate (2) so as to overlap each other when the mounting substrate (2) is viewed in plan.

According to this configuration, a path between the first filter and the input switch (20) can be shortened.

The high-frequency module (1E) of a twelfth aspect further includes the antenna switch (11) and the output switch (13), in any one of the second and seventh to eleventh aspects. The antenna switch (11) and the output switch (13) are provided on the second main surface (22). Any one of the antenna switch (11), the output switch (13), and the low-noise amplifier (12) overlaps at least one of the matching circuit (30) and the input switch (20), when the mounting substrate (2) is viewed in plan.

According to this configuration, the high-frequency module (1) can be reduced in size.

In the high-frequency module (1E) of a thirteenth aspect, at least the low-noise amplifier (12) among the antenna switch (11), the output switch (13), and the low-noise amplifier (12) overlaps at least one of the matching circuit (30) and the input switch (20), when the mounting substrate (2) is viewed in plan, in the twelfth aspect.

According to this configuration, the high-frequency module (1) can be reduced in size.

In the high-frequency module (1E) of a fourteenth aspect, the output switch (13) and the low-noise amplifier (12) are disposed so as to be adjacent to each other, in the twelfth or thirteenth aspect.

According to this configuration, a path between the output switch (13) and the low-noise amplifier (12) can be shortened.

The communication device (200) of a fifteenth aspect includes the high-frequency module (1; 1A; 1B; 1C; 1D; 1E) according to any one of the first to fourteenth aspects, and the signal processing circuit (202) configured to process signals.

According to this configuration, a path between the input switch (20) and the matching circuit (30) can be made shortest. As a result, since a wiring loss is reduced, the deterioration of a noise figure of the low-noise amplifier (12) can be suppressed.

1, 1A, 1B, 1C, 1D, 1E, 1F HIGH-FREQUENCY MODULE
2 MOUNTING SUBSTRATE
11 ANTENNA SWITCH
12 LOW-NOISE AMPLIFIER
13 OUTPUT SWITCH
20 INPUT SWITCH
21 FIRST MAIN SURFACE
22 SECOND MAIN SURFACE
30 MATCHING CIRCUIT
40, 40a, 40b FILTER
80 THROUGH-SILICON VIA (TSV)
100 FRONT-END MODULE
200 COMMUNICATION DEVICE
202 SIGNAL PROCESSING CIRCUIT
D1 FIRST DIRECTION (THICKNESS DIRECTION)

The invention claimed is:

1. A high-frequency module, comprising:
a mounting substrate having a first main surface and a second main surface opposed to each other;
a low-noise amplifier;
an input switch connected to an input terminal of the low-noise amplifier; and
a matching circuit configured to perform impedance matching between the input switch and the low-noise amplifier,
wherein the matching circuit is disposed on the first main surface,
the input switch and the low-noise amplifier are disposed on the second main surface, and
when the mounting substrate is viewed in plan, the input switch overlaps at least a part of the matching circuit.

2. The high-frequency module according to claim 1, further comprising:
a first filter disposed on the first main surface,
wherein when the mounting substrate is viewed in plan, the input switch overlaps at least a part of the first filter.

3. The high-frequency module according to claim 2, further comprising:
a second filter different from the first filter disposed on the first main surface,
wherein the first filter and the second filter overlap each other, when the mounting substrate is viewed in plan.

4. The high-frequency module according to claim 2, further comprising:
an antenna switch; and
an output switch,
wherein the antenna switch and the output switch are provided on the second main surface.

5. The high-frequency module according to claim 3, further comprising:
an antenna switch; and
an output switch,
wherein the antenna switch and the output switch are provided on the second main surface.

6. The high-frequency module according to claim 1, further comprising:
an antenna switch; and
an output switch,
wherein the antenna switch and the output switch are provided on the second main surface.

7. A communication device comprising:
the high-frequency module according to claim 1; and
a signal processing circuit configured to perform signal processing.

8. A high-frequency module, comprising:
a mounting substrate having a first main surface and a second main surface opposed to each other;
a low-noise amplifier;
an input switch connected to an input terminal of the low-noise amplifier; and a matching circuit configured to perform impedance matching between the input switch and the low-noise amplifier, wherein the input switch and the matching circuit are disposed on or above the first main surface, the low-noise amplifier is disposed on the second main surface, and when the mounting substrate is viewed in plan, the matching circuit and the input switch overlap each other.

9. The high-frequency module according to claim 8, wherein the matching circuit and the input switch are disposed in this order, in a thickness direction of the mounting substrate, with respect to the mounting substrate.

10. The high-frequency module according to claim 9, wherein the matching circuit and the input switch are connected to each other with a through-silicon via interposed therebetween.

11. The high-frequency module according to claim 10, further comprising:

a first filter disposed on the first main surface, wherein the first filter is provided on the first main surface so as to be adjacent to the matching circuit and the input switch.

12. The high-frequency module according to claim 9, further comprising:

a first filter disposed on the first main surface, wherein the first filter is provided on the first main surface so as to be adjacent to the matching circuit and the input switch.

13. The high-frequency module according to claim 8, further comprising:

a first filter disposed on the first main surface, wherein the first filter is provided on the first main surface so as to be adjacent to the matching circuit and the input switch.

14. The high-frequency module according to claim 13, wherein the first filter is connected to the input switch by wire bonding.

15. The high-frequency module according to claim 14, further comprising:

a second filter disposed on the first main surface and different from the first filter, wherein the first filter and the second filter are disposed in an order of the second filter and the first filter, with respect to the mounting substrate, so as to overlap each other when the mounting substrate is viewed in plan.

16. The high-frequency module according to claim 13, further comprising:

a second filter disposed on the first main surface and different from the first filter, wherein the first filter and the second filter are disposed in an order of the second filter and the first filter, with respect to the mounting substrate, so as to overlap each other when the mounting substrate is viewed in plan.

17. The high-frequency module according to claim 8, further comprising:

an antenna switch; and an output switch, wherein the antenna switch and the output switch are provided on the second main surface, and any one of the antenna switch, the output switch, and the low-noise amplifier overlaps at least one of the matching circuit and the input switch, when the mounting substrate is viewed in plan.

18. The high-frequency module according to claim 17, wherein at least the low-noise amplifier among the antenna switch, the output switch, and the low-noise amplifier overlaps at least one of the matching circuit and the input switch, when the mounting substrate is viewed in plan.

19. The high-frequency module according to claim 17, wherein the output switch and the low-noise amplifier are disposed so as to be adjacent to each other.

20. A high-frequency module, comprising:

a mounting substrate;

a low-noise amplifier;

an input switch connected to an input terminal of the low-noise amplifier; and a matching circuit configured to perform impedance matching between the input switch and the low-noise amplifier, wherein one of the matching circuit and the input switch is disposed on a main surface of the mounting substrate, and another one of the matching circuit and the input switch is built in the mounting substrate, and when the mounting substrate is viewed in plan, the input switch overlaps at least a part of the matching circuit.

* * * * *